US006809561B2

United States Patent
Katoh et al.

(10) Patent No.: US 6,809,561 B2
(45) Date of Patent: Oct. 26, 2004

(54) SEMICONDUCTOR POWER CONVERTING APPARATUS

(75) Inventors: Shuji Katoh, Hitachiota (JP); Shigeta Ueda, Hitachi (JP); Hiromitsu Sakai, Tokai (JP); Takashi Ikimi, Hitachi (JP); Tomomichi Ito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/638,400

(22) Filed: Aug. 12, 2003

(65) Prior Publication Data

US 2004/0027193 A1 Feb. 12, 2004

Related U.S. Application Data

(63) Continuation of application No. 10/099,950, filed on Mar. 19, 2002.

(30) Foreign Application Priority Data

Aug. 29, 2001 (JP) ........................................ 2001-259121

(51) Int. Cl.$^7$ ................................................ H03K 3/00
(52) U.S. Cl. ........................ 327/108; 327/432; 327/433
(58) Field of Search ........................ 327/108–112, 427, 327/432, 433

(56) References Cited

U.S. PATENT DOCUMENTS 4,721,869 A    1/1988   Okado
4,949,213 A    8/1990   Sasagawa et al.
5,210,479 A    5/1993   Kimura et al.
5,274,541 A  * 12/1993  Kimura et al. ................. 363/56

OTHER PUBLICATIONS

IPEC 2000, pp. 670–675.

The published abstract of the Japanese Electric Society Industrial Application Department Meeting in 1999, vol. 2, pp. 119–120.

* cited by examiner

Primary Examiner—Kenneth B. Wells
(74) Attorney, Agent, or Firm—Antonelli, Terry, Stout & Kraus, LLP

(57) ABSTRACT

A semiconductor power converting apparatus including at least one series arrangement of MOS control semiconductor devices such as Insulator-gate Bipolar Transistors (IGBTs) or metal oxide MOS transistors which are respectively applied with a gate voltage under the control of corresponding a driver. The driver contains a supply line having a higher potential than a gate voltage of an IGBT coupled thereto when the IGBT is in a steady ON state, and is such that is causes an increase of the gate voltage of the IGBT in accordance with the current of the supply line when a potential difference between the power supply line and an emitter of the IGBT is constant and the collector voltage thereof exceeds a predetermined value under an ON state of the IGBT.

15 Claims, 12 Drawing Sheets

SEMICONDUCTOR POWER CONVERTING APPARATUS

This application is a continuation of U.S. application Ser. No. 10/099,950, filed Mar. 19, 2002, the entire disclosure of which is hereby incorporated by reference.

BACKGROUND OF THE INVENTION

The present invention generally relates to a semiconductor power converting apparatus with employment of semiconductor elements and the like. More specifically, the present invention is directed to a semiconductor power converting apparatus capable of suppressing an occurrence of an overvoltage while a switching operation is carried out.

As disclosed in IPEC2000 S-17-3 "Development of IEGT series and Parallel Connection Technology for High Power Converters", each of the arms of a power converter is constituted by a series connection of MOS control semiconductor devices such as IGBTs (insulated-gate bipolar transistors), so that a MOS control semiconductor power converter for outputting a high AC voltage and a high DC voltage can be realized. Since the MOS control semiconductor elements which are series-connected to each other and constitute each of these arms are turned ON or OFF at the same time in response to a pulse signal controlled by either the PWM (pulse width modulation) control or the PAM (pulse-amplitude modulation) control, the DC voltage may be converted into the AC voltage and/or the AC voltage may be converted into the DC voltage.

On the other hand, in another known technique, there are disclosed MOS control semiconductors series-connected to each other, which constitute the respective arms, that may be protected from overvoltages. The published abstract of the Japanese Electric Society Industrial Application Department Meeting in 1999, vol. 2, entitled "Switching Test of Flat-pack IGBTs connected in Series", pp. 119–120 describes the following protection technique. That is, the avalanche element is connected between the gate and the collector of the IGBT and is brought into the conductive state when this avalanche element exceeds a predetermined voltage and thus avalanches. The voltage of the avalanche element is also increased in connection with the increase of the collector voltage the IGBT. When this voltage of the avalanche element exceeds the avalanche voltage of the avalanche element, the current is supplied from the collector of the IGBT to the gate thereof via this avalanche element, so that the gate voltage of the IGBT is increased and, correspondingly, the impedance of the IGBT is reduced. As a result, the collector voltage of the IGBT is suppressed in order that the IGBT can be protected from the element destruction (breakdown) due to an overvoltage. Also, this publication, entitled "Switching Test for Series-Connection of Planar IGBTs", in vol. 2 (1999) of the lecture on Japanese Electric Society Industrial Application Department discloses that the MOS control semiconductors can be protected in such a manner that the gate voltage is increased so as to increase the saturated current value.

SUMMARY OF THE INVENTION

However, in the above-described publication entitled "Switching Test for Series-Connection of Planar IGBTs" in the published abstract of Japanese Electric Society Industrial Application Department Meeting in 1999, vol. 2, in such a case that an overcurrent is supplied to an arm under an ON state, among the arms which constitute the MOS control semiconductor converter, the MOS control semiconductor having the lowest saturated current selected amongst the series-connected MOS control semiconductors (e.g., IGBTs) of that arm limits this overcurrent to the saturated current value of that IGBT. As a consequence, since the MOS control semiconductor having the lowest saturated current limits the current, the impedance thereof is increased and the voltage sharing of this MOS control semiconductor is increased. Thus, the semiconductor element may be destroyed due to the application of the overvoltage.

Further, in the above-described publication entitled "Switching Test for Series-Connection of Planar IGBTs" in the published abstract of Japanese Electric Society Industrial Application Department Meeting in 1999, vol. 2, an additionally expensive semiconductor element having a high-voltage withstanding avalanche voltage equivalent to that of such an IGBT to be protected is also required.

The present invention has an object to provide a semiconductor power converting apparatus containing such a circuit capable of preventing an application of an overvoltage. That is, in order to protect MOS control semiconductor devices from the overvoltage, when an overcurrent flows through these MOS control semiconductor devices, this circuit can avoid such an operation that the overvoltage is applied to such an MOS control semiconductor having a minimum saturated current among the series-connected MOS control semiconductor devices, while such a semiconductor element having an avalanche voltage equal to the high withstand voltage is not employed.

According to one aspect of a semiconductor power converting apparatus of the present invention, while a current is supplied to a gate of an IGBT from a gate driver of a MOS control semiconductor, a gate voltage of such an MOS control semiconductor which has reached a saturated current is increased to a voltage higher than a gate voltage obtained under steady ON state, and thus, the saturated current value of this MOS control semiconductor element is increased.

In general, such a relationship as shown in FIG. 2 is established between a collector-to-emitter voltage (will be referred to as a "collector voltage" hereinafter) of an MOS control semiconductor such as an IGBT, and a collector current of this MOS control semiconductor. When the collector voltage is increased at an arbitrary gate-to-emitter voltage (will be referred to as a "gate voltage" hereinafter), the collector current is also increased in connection with this operation. When this increased collector current reaches a certain current value, this collector current does not exceed this reached current value. This maximum current value is referred to as a "saturated current value." As shown by FIG. 2, when the gate voltage becomes increased, the larger the saturated current value also becomes increased.

As shown in FIG. 3, MOS control semiconductors 11 to 14 such as IGBTs having different saturated current values from each other are series-connected to each other and the series-connected MOS control semiconductors are connected to a voltage source 21. Also, it is assumed that saturated current values of the respective IGBTs (namely, saturated current value at gate voltages under steady ON states) are defined by IGBT 11<IGBT 12<IGBT 13<IGBT 14. In the case that all of the series-connected IGBTs are brought into ON states, a current may flow through this IGBT series-connection at a current increased rate which is determined based upon both a leakage impedance 23 of a wiring line and the voltage source 21. Generally speaking, since a gate voltage of an IGBT is controlled in such a manner that this gate voltage may become a certain gate voltage higher than a threshold value, the IGBT is transferred from an OFF state into an ON state. In this connection, "a certain gate voltage higher than a threshold value" will be referred to as a "steady ON gate voltage" hereinafter in this specification.

In the case that a current flowing through the IGBT series-connection indicated in FIG. 3 reaches the saturated current value during the steady ON gate voltage of the IGBT 11 having the lowest saturated current, this IGBT 11, having the lowest saturated current, limits this current. As a consequence, since the IGBT 11 limits the current, the impedance thereof is increased. Since a voltage applied to a certain element is equal to a product between an impedance of this element and a current flowing through this element, the collector voltage of the IGBT 11 is increased while the impedance is increased.

However, when the collector voltage of the IGBT under ON state exceeds a previously set value, if the gate circuit functions such that when the collector voltage increases, the gate voltage of the IGBT also increases, then the gate voltage of the IGBT 11 becomes higher than the steady ON gate voltage in connection with an increase of the collector voltage of the IGBT 11, so that the saturated current value of the IGBT 11 can be increased up to the saturated current value of the IGBT 12 at the steady ON gate voltage. It should be noted that the previously set value is set within a range defined from the steady OFF voltage and the withstanding voltage of the semiconductor element. When the saturated current value of the IGBT 11 reaches the saturated current value of the IGBT 12, both the IGBT 11 and the IGBT 12 may limit the current, so that the voltage sharing by the IGBT 11 can be reduced by ½. As a result, in the case that the voltage of the DC voltage source 21 is smaller than the summed value of the IGBT 11 and the IGBT 12, it is possible to avoid such an operation that the semiconductor elements are destroyed, or brought into the breakdown state due to the overvoltage applied to the IGBT.

On the other hand, In such a case that the voltage of the DC voltage source 21 is higher than a total value of the element withstanding voltages of both the IGBT 11 and the IGBT 12, the collector voltages of both the IGBT 11 and the IGBT 12 are further increased. In connection to this collector voltage increase, the gate voltages of both the IGBT 11 and the IGBT 12 are further increased, so that the saturated current values of the IGBT 11 and the IGBT 12 can reach the saturated current value of the IGBT 13 at the steady ON gate voltage. When the saturated current values of both the IGBT 11 and the IGBT 12 reach the saturated current of the IGBT 13, the voltage of the DC power source 21 can be shared by three sets of IGBTs, namely the IGBT 11, the IGBT 12, and the IGBT 13. As a result, if the voltage of the DC power source 21 is lower than the element withstanding voltages of the IGBT 11, the IGBT 12, and the IGBT 13, then it is possible to avoid the element breakdown caused by the application of the overvoltage.

Also, in such a case that the voltage of the DC voltage source 21 is higher than a total value of the element withstanding voltages of the IGBT 11, the IGBT 12, and the IGBT 13, the collector voltages of the IGBT 11, the IGBT 11, and the IGBT 13 are further increased. In connection to this collector voltage increase, the gate voltages of the IGBT 11, the IGBT 12, and the IGBT 13 are further increased, so that the saturated current values of the IGBT 11, the IGBT 12, and the IGBT 13 are reached to the saturated current value of the IGBT 14. When the saturated current values of the IGBT 11, IGBT 12, the IGBT 13 and the IGBT 14 are equal to each other, the voltage of the DC voltage source 21 can be shared by four sets of the IGBTs, namely, the IGBT 11, the IGBT 12, the IGBT 13, and the IGBT 14.

On the other hand, since the series-connection of the IGBT 11 to the IGBT 14 may block the voltage of the voltage source 21 under OFF state, a total value of the element withstanding voltages of the series-connection constructed of the IGBT 11 to the IGBT 14 necessarily exceeds the voltage of the voltage source 21. As a consequence, if the saturated currents of the IGBT 11, the IGBT 12, the IGBT 13, and the IGBT 14 are equal to each other, then the voltage of the DC voltage source 21 can be shared by four sets of the IGBTs, namely, the IGBT 11, the IGBT 12, the IGBT 13, and the IGBT 14. As a result, it is possible to prevent the semiconductor elements from being destroyed due to the application of the overvoltage.

Other objects, features and advantages of the invention will become apparent from the following description of the embodiments of the invention taken in conjunction with the accompanying drawings.

DETAILED DESCRIPTION OF THE EMBODIMENTS

Figure 1:
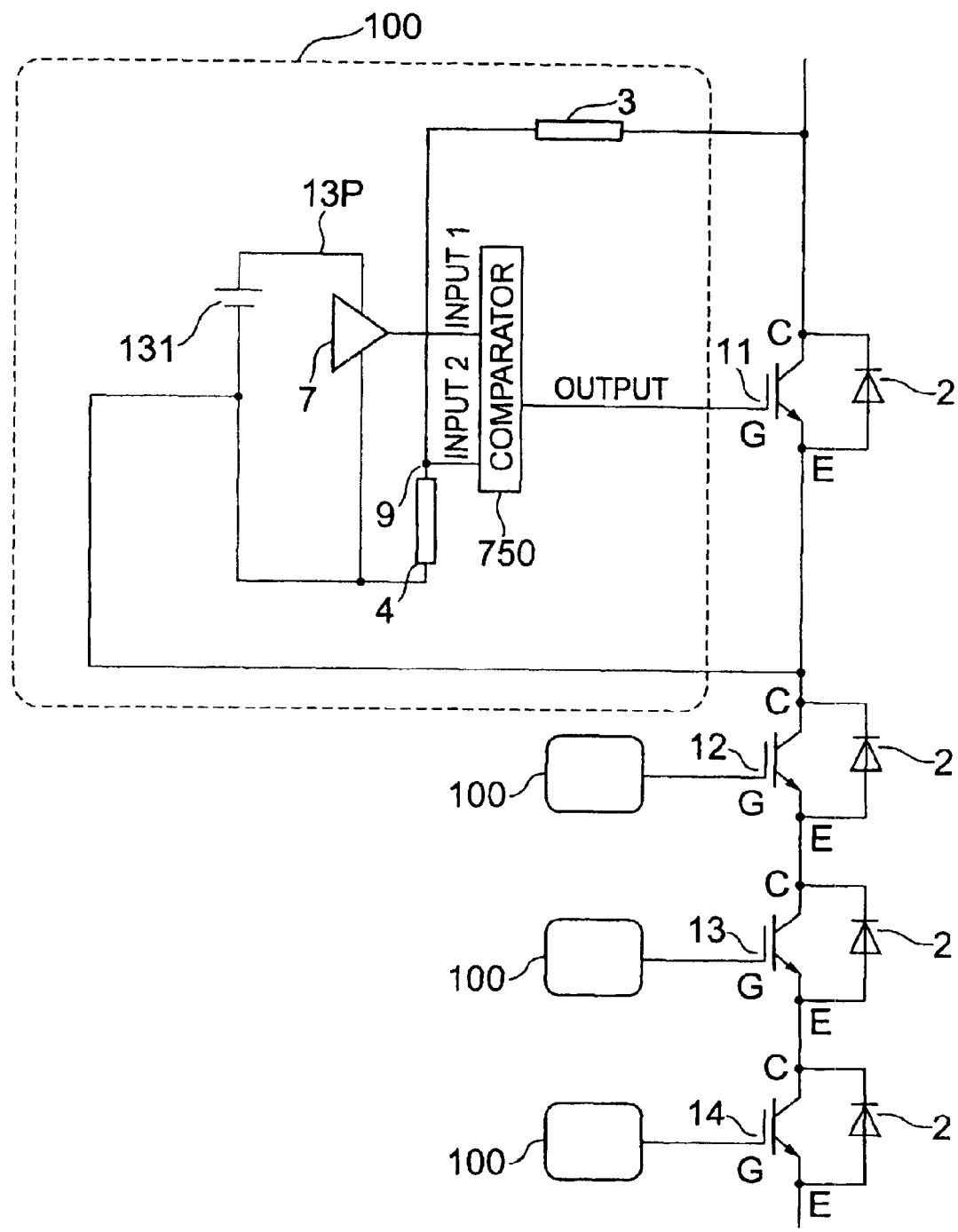
FIG. 1 is a circuit diagram schematically showing a major unit of one arm of a power converter according to an embodiment 1 of the present invention.
Figure 2:
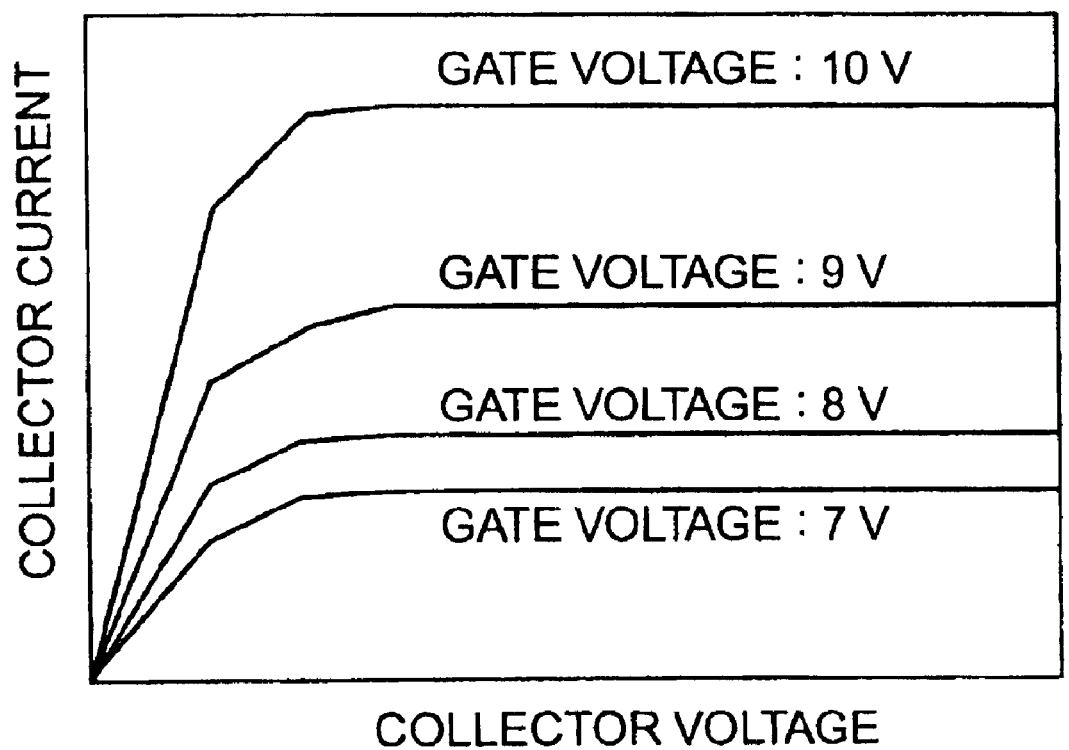
FIG. 2 is a graph for graphically indicating a characteristic of an IGBT employed in a semiconductor power converting apparatus of the present invention.
Figure 3:
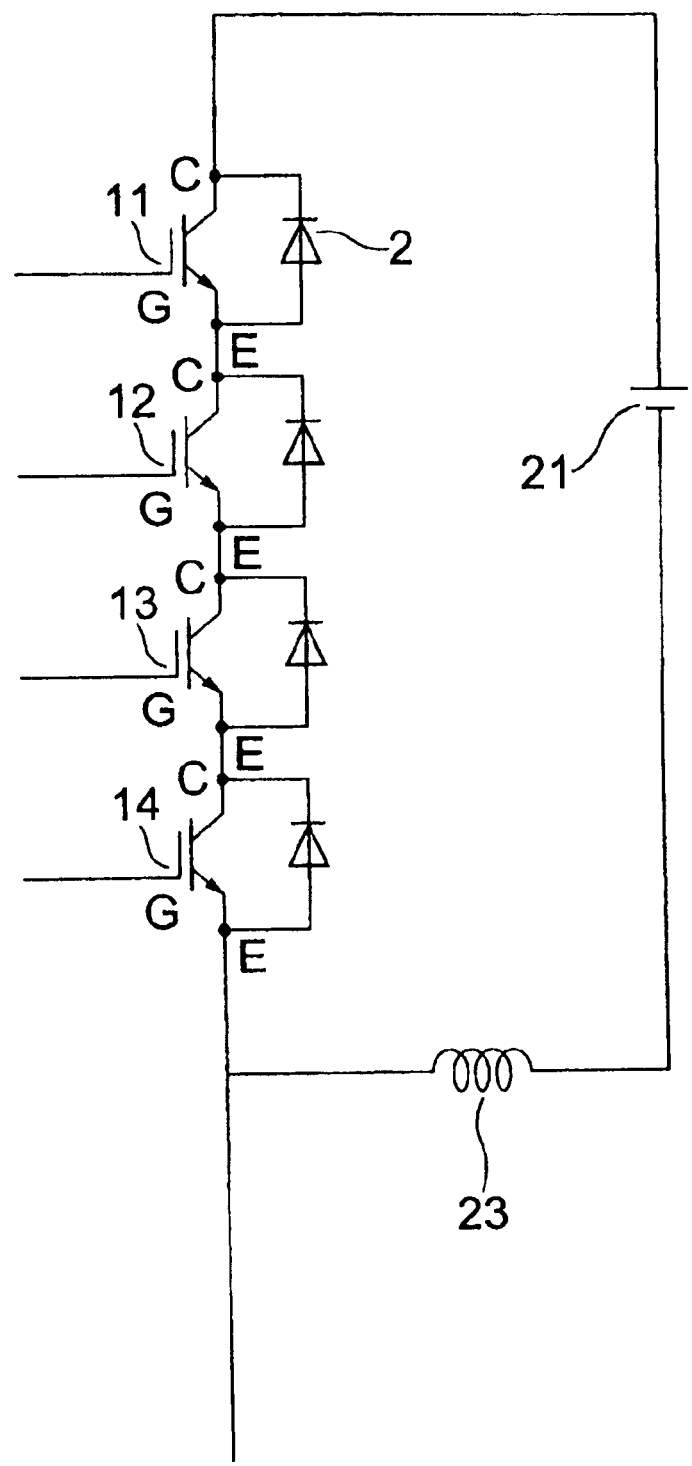
FIG. 3 is an explanatory diagram for explaining a series-connection of MOS control semiconductors having different saturated currents from each other.

Referring now to drawings, various embodiments of the present invention will be described in detail. It should be understood that the same reference numerals will be employed as those for indicating the circuit elements having the same functions in the respective embodiments. It should also be noted that potentials appearing at the respective terminals of each of the IGBTs such as from an IGBT 11 to an IGBT 14, and also potentials within the respective gate circuits are defined in terms of an emitter potential which is used as a reference with respect to each of those IGBTs. In other words, it is so assumed that a collector potential of the IGBT 11 corresponds to a collector-to-emitter voltage of the IGBT 11, whereas a collector potential of the IGBT 12 corresponds to a collector-to-emitter voltage of the IGBT 12. It should also be noted that even when an IGBT is replaced by another MOS control semiconductor device such as an MOSFET, a similar effect to that of the below-mentioned embodiment may be achieved.

Embodiment 1

Figure 4:
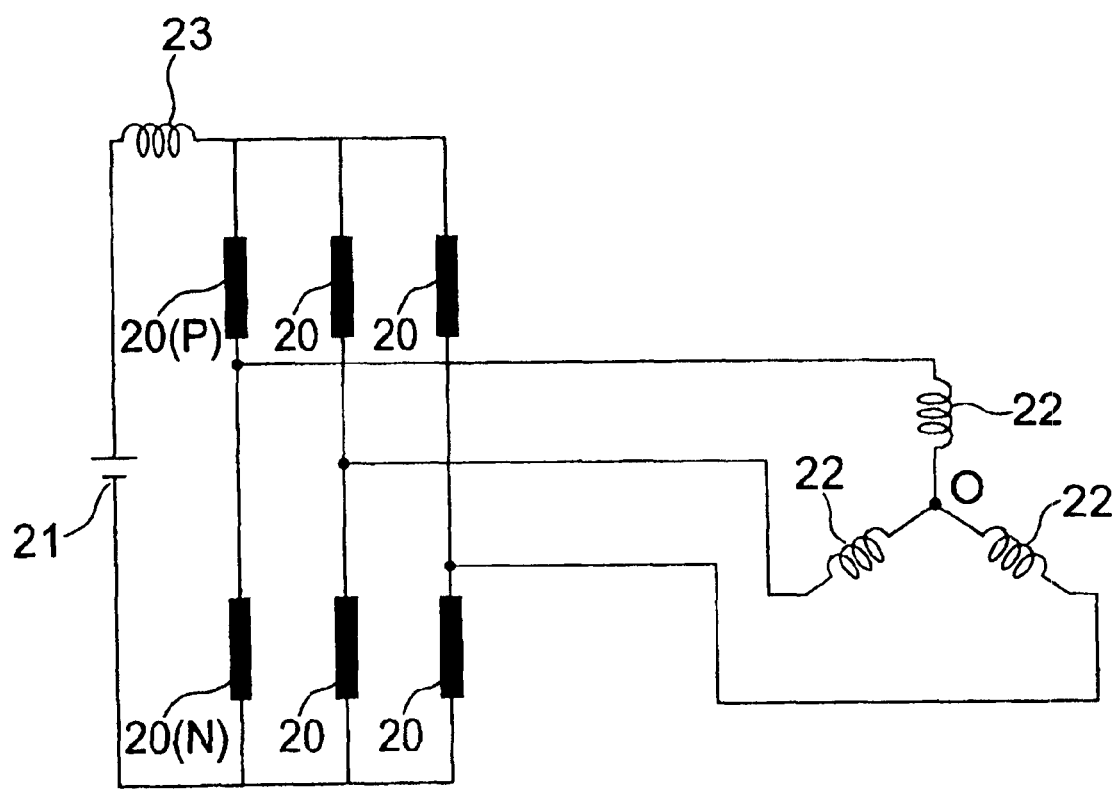
FIG. 4 is a schematic diagram for indicating a major unit of a power converter to which the present invention is applied.

An arrangement of a semiconductor power converting apparatus according to this embodiment 1 of the present invention will now be described with reference to FIG. 1 and FIG. 4. FIG. 4 schematically shows a major unit of the semiconductor power converting apparatus according to this embodiment 1, and FIG. 1 schematically represents an arm 20 of the major unit shown in FIG. 4. In the power converting apparatus of FIG. 4, three sets of two series-connected arms 20 are connected in a parallel manner, and these arms 20 are connected to a DC voltage source 21. Each of neutral points of the paired arms is connected to a load 22.

A structure of an arm is given as follows: That is, in each arm, IGBTs are series-connected to each other, and a flywheel diode 2 is in an inverse-parallel connection with each of these series-connected IGBTs. Also, a gate circuit 100 is connected to each of the IGBTs. While the present invention is not necessarily limited to a specific series-connection number of IGBTs, four sets of IGBTs (namely, IGBT 11, IGBT 12, IGBT 13, and IGBT 14) are series-connected to each other in the example of FIG. 1. The gate circuit 100 is connected to a gate G and an emitter E of each of the IGBT 11, the IGBT 12, the IGBT 13, and the IGBT 14. Also, the diode 2 is in an inverse-parallel connection with each of the four IGBTs.

The gate circuit 100 is formed by employing the below-mentioned circuit arrangement. A description will now be made by exemplifying such a gate circuit 100 connected to the IGBT 11. While a voltage source 131 is connected to the emitter of the IGBT 11, electric power required for driving a pulse generator 7 is supplied from this voltage source 131 to this pulse generator 7.

Figure 5:
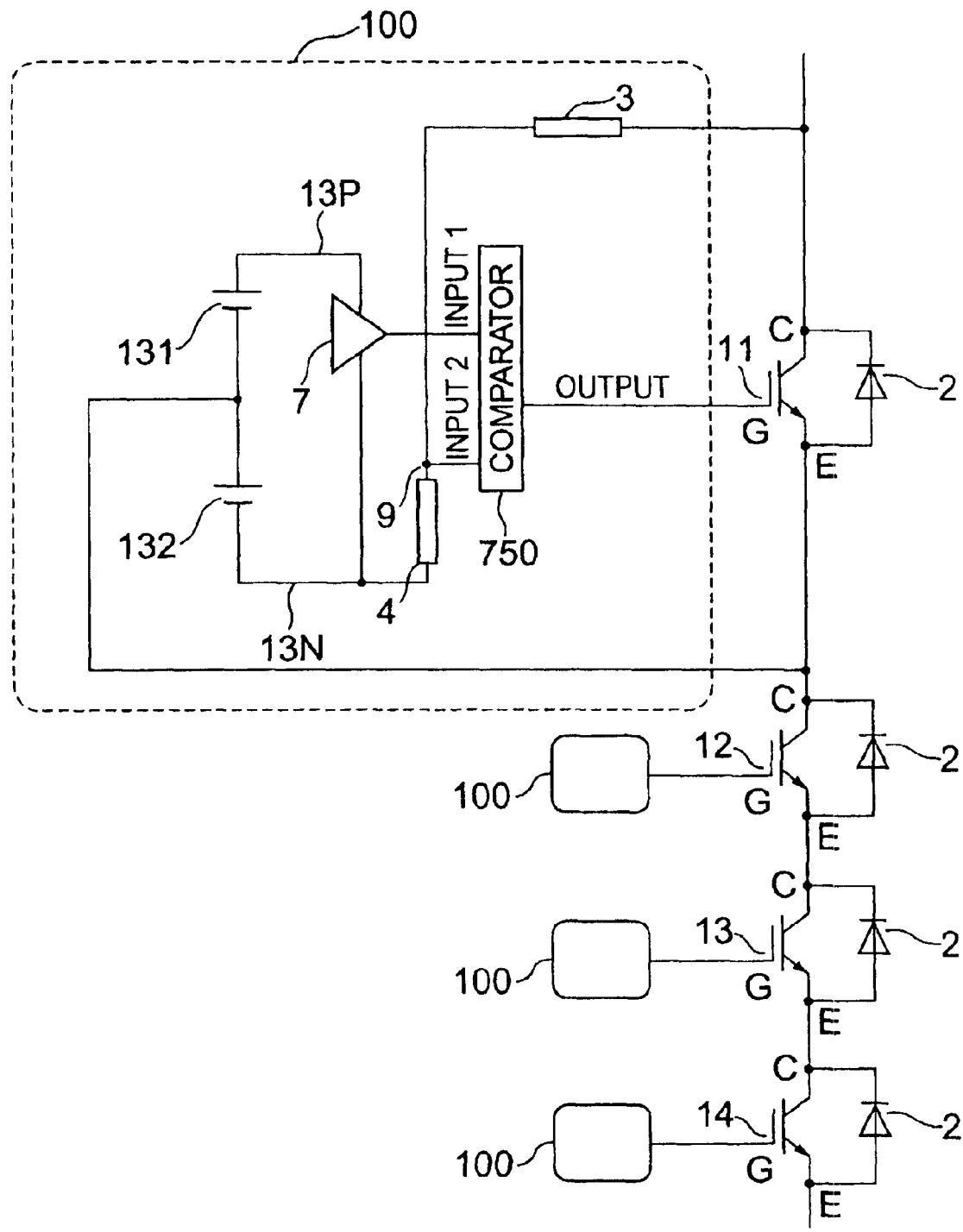
FIG. 5 is a circuit diagram for indicating a major unit of one arm of a power converter according to the embodiment 1 of the present invention.

As shown in FIG. 5, while the voltage source 131 is series-connected to another voltage source 132, and also a center point between these voltage sources 131 and 132 is connected to the emitter of the IGBT 11, the electric power required for driving the pulse generator 7 may be supplied from both the voltage source 131 and the voltage source 132. In this alternative case, a terminal of a high voltage side of the voltage source 131 is connected to a power supply line 13P, and a terminal of a low voltage side of the voltage source 132 is connected to another power supply line 13N. An output of the pulse generator 7 is connected to one input 1 of a comparator 750. Another input 2 of the comparator 750 is connected to a voltage dividing point at which a collector-to-emitter voltage of the IGBT 11 is sub-divided by both a resistor 3 and a resistor 4. This connection point of the input 2 of the comparator 750 need not be selected to the voltage dividing point, but may be connected to any point in which while the collector potential of this IGBT 11 is increased, the potential of this connection point may be increased. The comparator 750 compares potentials of these two inputs thereof to output a higher potential. The output of the comparator 750 is connected to the gate of this IGST 11, and the gate potential of the IGBT 11 is controlled to the output potential of the comparator 750.

Figure 6:
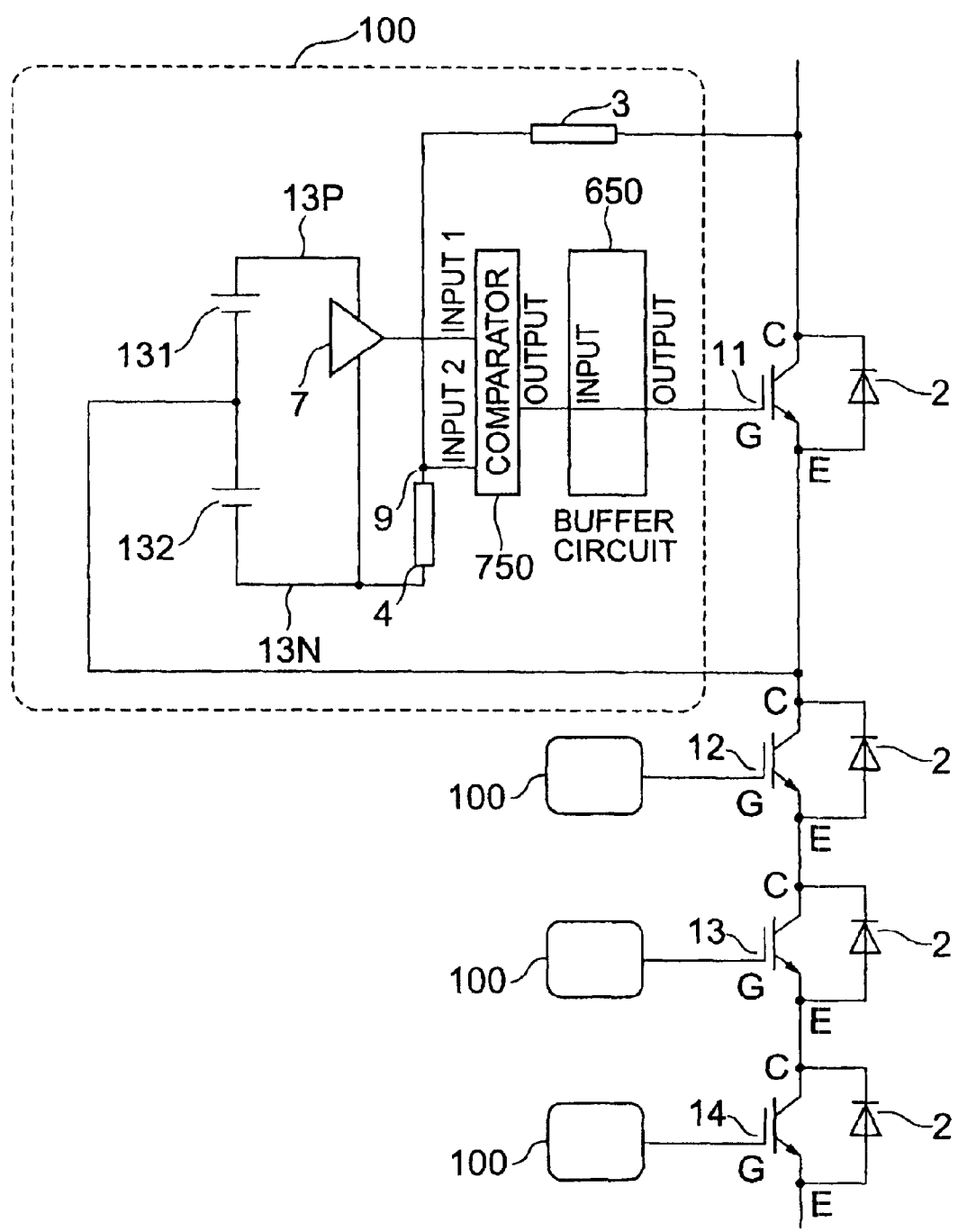
FIG. 6 is a circuit diagram for representing another major unit of one arm of the power converter according to the embodiment 1 of the present invention.

As shown in FIG. 6, such an amplifying circuit as a buffer circuit 650 may be connected between the comparator 750 and the gate of the IGBT 11. In this alternative case, the output of the comparator 750 is connected to an input of the buffer circuit 650, and an output of this buffer circuit 650 is connected to the gate of the IGBT 11. With the addition of the buffer circuit 650, the gate potential of the IGBT 11 may be controlled in a high speed.

Next, operations of the power converting apparatus will now be explained. While electric power required for driving the pulse generator 7 is supplied from the voltage source 131, a pulse signal which is controlled by way of either the PWM control or the PAM control is outputted from the pulse generator 7. Normally, the pulse signal which is controlled by way of either the PWM control or the PAM control is transmitted from another upper-graded circuit (not shown) to the pulse generators 7 of the respective gate circuits 100 of the IGBT 11 through the IGBT 14, which are series-connected to each other. In response to the transmitted signals, the pulse generators 7 generate such pulse signals which are controlled by way of either the PWM control or the PAW control. The generated pulse signal is supplied via the comparator 750 to the gate of the IGBT 11 so as to turn ON, or OFF this IGBT 11. In the present invention, such a potential obtained when the IGBT 11 is turned ON and then the gate potential thereof is brought into a steady state is defined as a steady ON-gate voltage. Since the IGBT 11, the IGBT 12, the IGBT 13, and the IGBT 14 are switched at the same time, the arm 20 is turned ON/OFF so as to produce an AC voltage, so that this AC voltage is applied to the load 22. Under normal condition, both an arm 20 (N) and another arm 20 (P) are alternately ON/OFF-controlled, and the paired arms are not turned ON at the same time. In other words, both the arm 20 (P) and the arm 20 (N) are not turned ON at the same time. Such a voltage produced by dividing the voltage of the DC voltage source 21 by a total series-connection number of the IGBTs employed in each of the arms corresponds to a steady voltage of an IGBT under OFF connection. This voltage will be referred to as "steady OFF voltage" thereinafter in this specification.

In this case, an attention is paid to such a time instant when a drive signal to the arm 20 (P) is brought into an ON state and the arm 20 (N) is brought into an OFF state in the power converter of FIG. 4. When the arm 20 (P) is brought into the ON state, a current flows through such a path from the DC voltage source 21 to the arm 20 (P) and the inductance load 22. At this time, in the case that the arm 20 (N) is erroneously turned ON, or shortcircuited due to some reason, a current will flow through such a path defined from the DC voltage source 21 via the arm 20 (P) and the arm 20 (N) to the DC voltage source 21. Since both the arm 20 (P) and the arm 20 (N) become low impedances at the same time, a large current may flow through this arm 20.

Operations of the power converting apparatus will now be explained by exemplifying such a case that the arm 20 (N) is shortcircuited. In accordance with the present invention, when a value of a current is reached to a saturated current value of the IGBT 11 having the lowest saturated voltage, this IGBT 11 limits this current and then a collector potential of this IGBT 11 is increased. Since the collector potential of the IGBT 11 is increased, the potential at the voltage dividing point 9 is increased. When the potential at the voltage dividing point 9 exceeds the potential of the pulse generator 7, the comparator 750 outputs the potential of this voltage dividing point (or node) 9 so as to control the gate potential of the IGBT 11 to the gate potential of the voltage dividing point. Normally, both a resistance value of a voltage-dividing resistor 3 and a resistance value of a voltage-dividing resistor 4 are set in such a manner that when a collector potential of an IGBT exceeds the steady OFF voltage, a potential of the voltage dividing point 9 may exceed a potential of the pulse generator 7.

When a collector potential of the IGBT 11 exceeds the steady OFF voltage, the gate potential of the IGBT 11 is increased, so that the saturated current value of this IGBT 11 is increased. While the saturated current value is increased, such a current which passes through the arm 20 (P) is also increased. In the case that the current is increased and then is reached to a saturated current value of the IGBT 12 whose saturated current value is the second lowest current value, the IGBT 12 having the second lowest current value limits the current, so that the collector potential of this IGBT 12 is increased. Since the IGBT 12 also shares the voltage of the DC voltage source, the increase of the collector potential of the IGBT 11 is once relaxed.

However, since both the IGBT 11 and the IGBT 12 limit the current, impedances thereof are increased, so that both the collector potential of the IGBT 11 and the collector potential of the IGBT 12 are increased. Since the collector potential of the IGBT 11 is further increased, the gate potential of this IGBT 11 is increased. Similar to both the operation of the gate circuit 100 connected to the IGBT 11 and the operation of this IGBT 11, since the collector potential of the IGBT 12 is increased, the gate potential of the IGBT 12 is also increased, and thus, both the saturated current values of the IGBT 11 and the IGBT 12 are increased. The saturated current values of both the IGBT 11 and the IGBT 12 are increased, and also, the current flowing through the arm 20 (P) is similarly increased. When this flowing current is reached to a saturated current value of the IGBT 13, the IGBT 13 subsequently limits the current, so that the corrector potential thereof is increased.

On the other hand, the potential increases of both the IGBT 11 and the IGBT 12 are once relaxed. However, since the IGBT 11, the IGBT 12, and the IGBT 13 may commonly limit the current, the impedances thereof are increased, so that the collector potentials of the IGBT 11, the IGBT 12, and the IGBT 13 are further increased. While the collector potentials are increased, the gate potentials of the IGBT 11, the IGBT 12, and the IGBT 13 are increased, and then, the current is reached to a saturated current value of the IGBT 14. Since the voltage of the DC voltage source 21 can be shared by the four sets of IGBTs (namely, IGBT 11, IGBT 12, IGBT 13, and IGBT 14), the element destruction caused by the overvoltage can be prevented. As a result, such an effect of this embodiment 1 can be achieved. That is, even when the overcurrent may flow through the MOS control semiconductors, these MOS control semiconductors such as IGBTs can be protected from the overvoltage.

Embodiment 2

Figure 7:
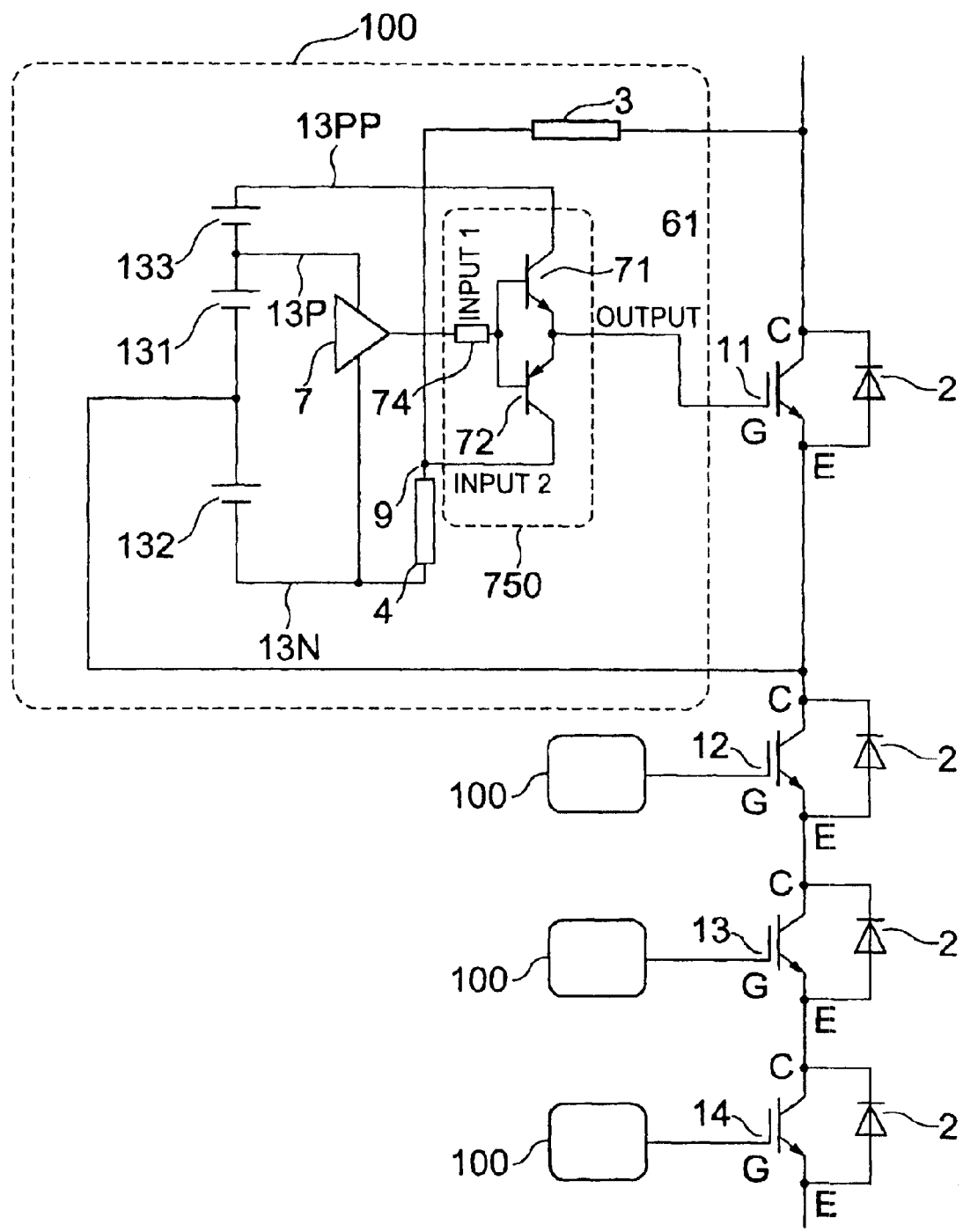
FIG. 7 is a circuit diagram for showing a major unit of one arm of a power converter according to an embodiment 2 of the present invention.

As indicated in FIG. 7, a semiconductor power converting apparatus according to an embodiment 2 of the present invention is arranged such that the comparator 750 of the above-described embodiment 1 is constituted by connecting a pnp transistor 72 and an npn transistor 71 in a complementary manner, the npn transistor 71 is connected to a power supply line 13PP having a higher potential than that of the power supply line 13P for driving the pulse generator 7.

A collector of the pnp transistor 72 is connected to the voltage dividing point 9, and a collector of the npn transistor 71 is connected to the power supply line 13PP. The pulse generator 7 is driven by both the voltage source 131 and the voltage source 132. When the IGBT is set to an ON state, the pulse generator 7 outputs the potential of the power supply line 13P, whereas when the IGBT is set to an OFF state, the pulse generator 7 outputs the potential of the power supply line 13N. The potential of the power supply line 13PP is higher than the potential of the power supply line 13P by such a voltage difference of the voltage source 133.

While the IGBT 11 is exemplified, a description will now be made of operations in which when the collector potential of the IGBT is increased under the ON state of this IGBT, the gate potential is increased so as to increase the saturated current value. When the collector potential of the IGBT 11 is increased, the potential of the voltage dividing point 9 is increased. Since the ON state of this IGBT is supposed, the pulse generator 7 outputs the potential of the power supply line 13P. The comparator 750 outputs the potential of the pulse generator 7, received via resistor 74, until the potential of the voltage dividing point 9 is reached to the output potential of the pulse generator 750, namely, reached to the potential of the power supply line 13P. When the potential of the voltage dividing point 9 becomes higher than the output potential of the pulse generator 7, a current will flow from the collector of the pnp transistor 72 to the base thereof, and thus, a base potential of the npn transistor 71 becomes higher than a base potential of the pnp transistor 72, so that this npn transistor 71 is brought into the ON state. Since the potential of the power supply line 13PP to which the collector of the npn transistor 71 is connected is higher than a maximum output potential of the pulse generator 7, the potential of the emitter of the npn transistor 71, namely, the output potential of the comparator 750, can be increased.

As a consequence, also in this embodiment 2, since the gate potential of the IGBT 11 can be increased higher than the gate voltage under the steady ON state and, also, the saturated current value of the IGBT can be increased similar to the embodiment 1, the IGBT can be protected from the overvoltage in a manner similar to that of the embodiment 1. It should also be noted that it is practically difficult to increase the gate potential of the IGBT 11 higher than a summed voltage of the voltage source 131 and the voltage source 132. As a consequence, the voltage of the voltage source 132 is set in such a manner that when the gate voltage of the IGBT 11 is equal to the summed voltage between the voltage source 131 and the voltage source 132, a saturated current value becomes higher than the saturated current value during the steady ON gate voltage of the IGBT 14.

Embodiment 3

Figure 8:
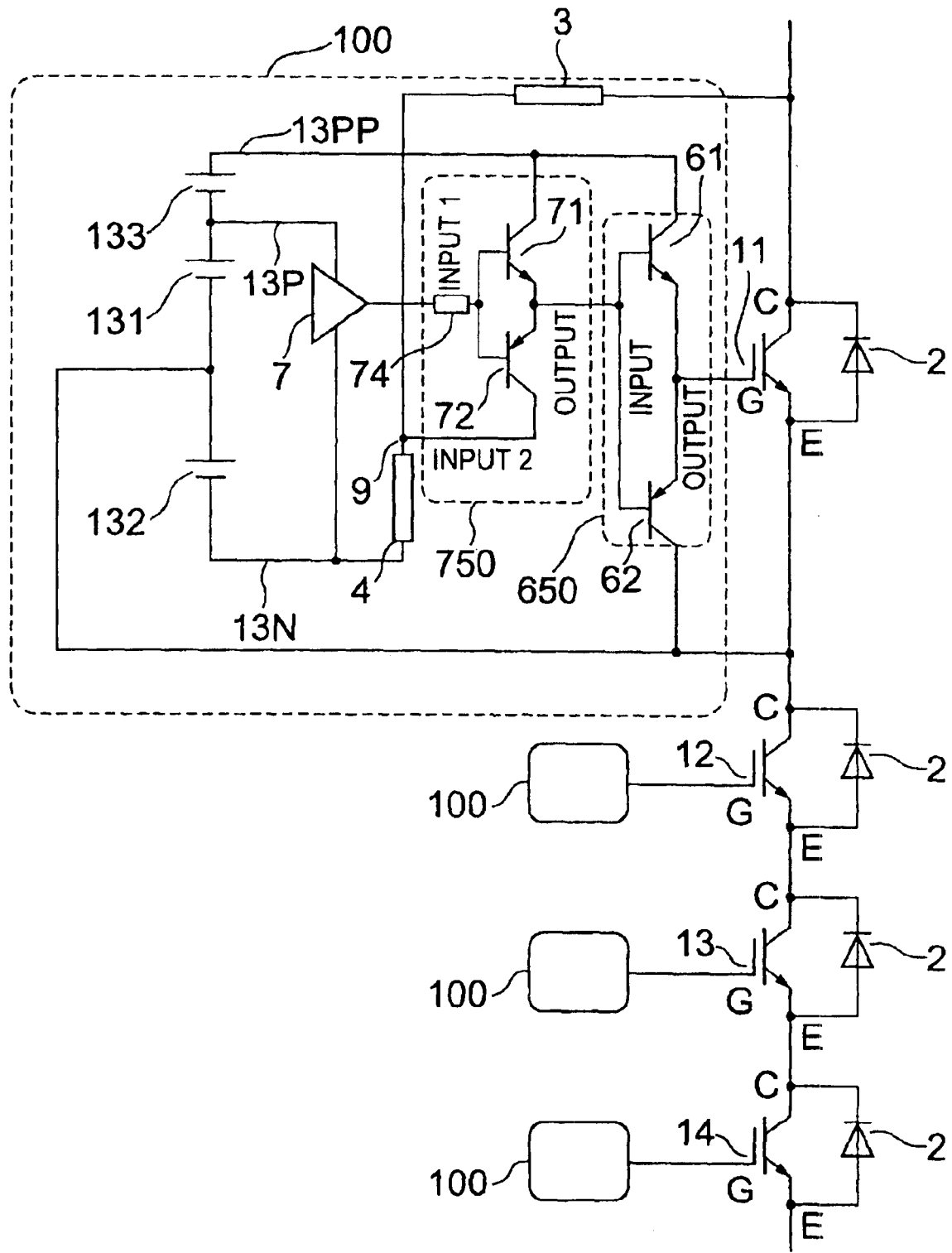
FIG. 8 is a circuit diagram for indicating a major unit of one arm of a power converter according to an embodiment 3 of the present invention.

In a semiconductor power converting apparatus of an embodiment 3 according to the present invention, as indicated in FIG. 8, in which a buffer circuit 650 is connected between the comparator 750 of the embodiment 3 and a gate of an IGBT, this buffer circuit 650 is arranged by connecting an npn transistor 61 and a pnp transistor 62 in a complementary manner. The buffer circuit 650 transmits a potential of the comparator 750 to the gate of the IGBT 11. As a consequence, similar to the above-described embodiment 1, since the gate potential of the IGBT 11 is increased to a level higher than the gate voltage of the steady ON state, in order to increase a saturated current value of the IGBT in this embodiment 3, this IGBT can be protected from the overvoltage in a similar manner to that of the above-described embodiment 1. Since the buffer circuit amplifies a current used to charge the gate of the IGBT, the gate potential of the IGBT can be quickly controlled to become the potential of the voltage dividing point 9, and also the IGBT can be more firmly protected from the overvoltage.

Embodiment 4

Figure 9:
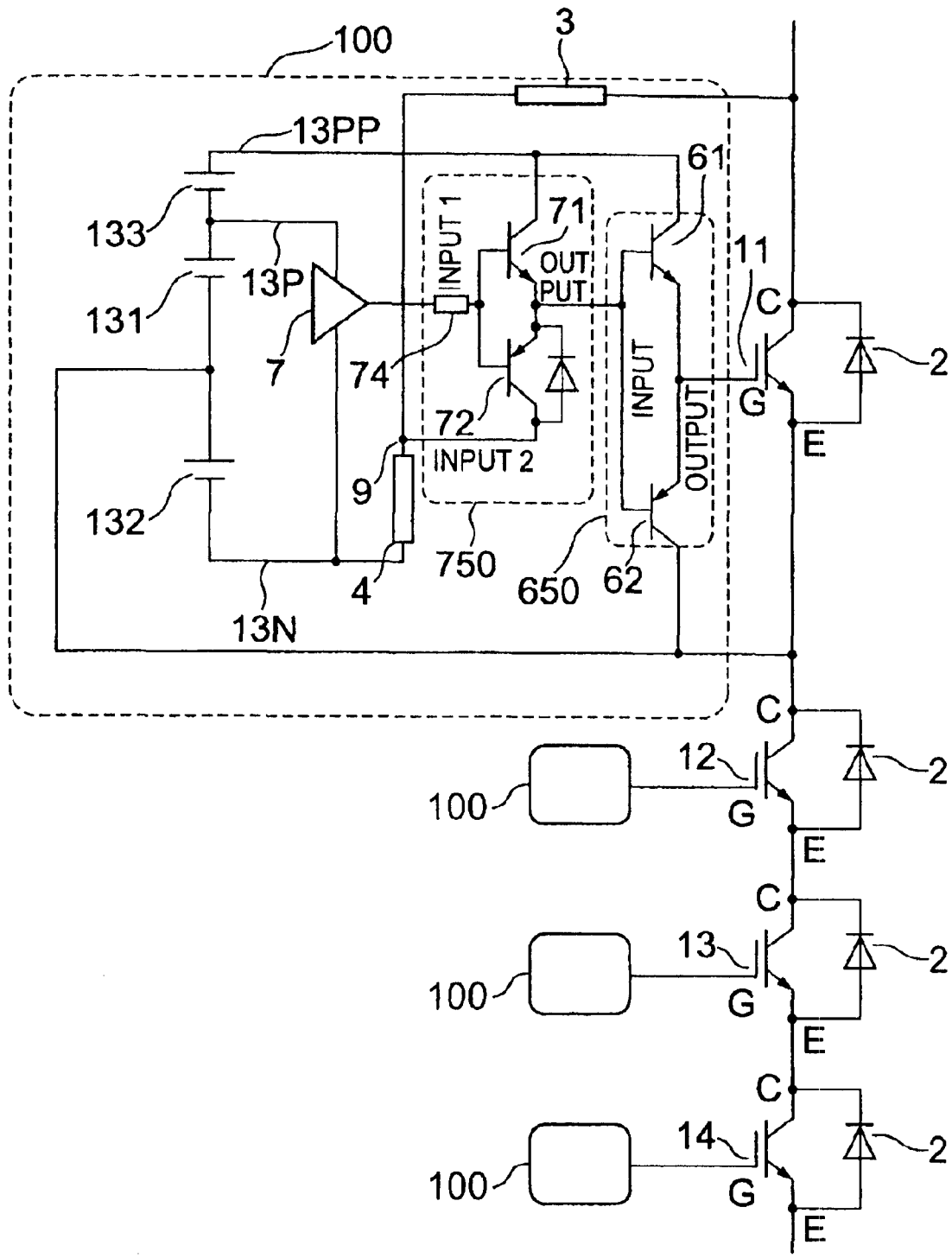
FIG. 9 is a circuit diagram for showing a major unit of one arm of a power converter according to an embodiment 4 of the present invention.

As indicated in FIG. 9, in a semiconductor power converting apparatus of an embodiment 4 according to the present invention, a diode 73 is in an inverse-parallel connection with the pnp transistor 72 of the embodiment 3. When a potential of the voltage dividing point 9 exceeds an output potential of the pulse generator 7, the output of the voltage dividing point 9 is outputted via the diode 73 to the output of the comparator 750, the output of the comparator 750 can be quickly controlled to become the potential of the voltage dividing point 9.

As a consequence, similar to the above-described embodiment 1, since the gate potential of the IGBT 11 is increased to a level higher than the gate voltage of the steady ON, state in order to increase a saturated current value of the IGBT in this embodiment 4, shown in FIG. 9, this IGBT can be protected from the overvoltage in a similar manner to that of the above-described embodiment 1. In accordance with this embodiment 4, the output of the comparator 750 can be quickly controlled to become the potential of the voltage dividing point 9, and thus the IGBT can be more securely protected from the overvoltage.

Embodiment 5

Figure 10:
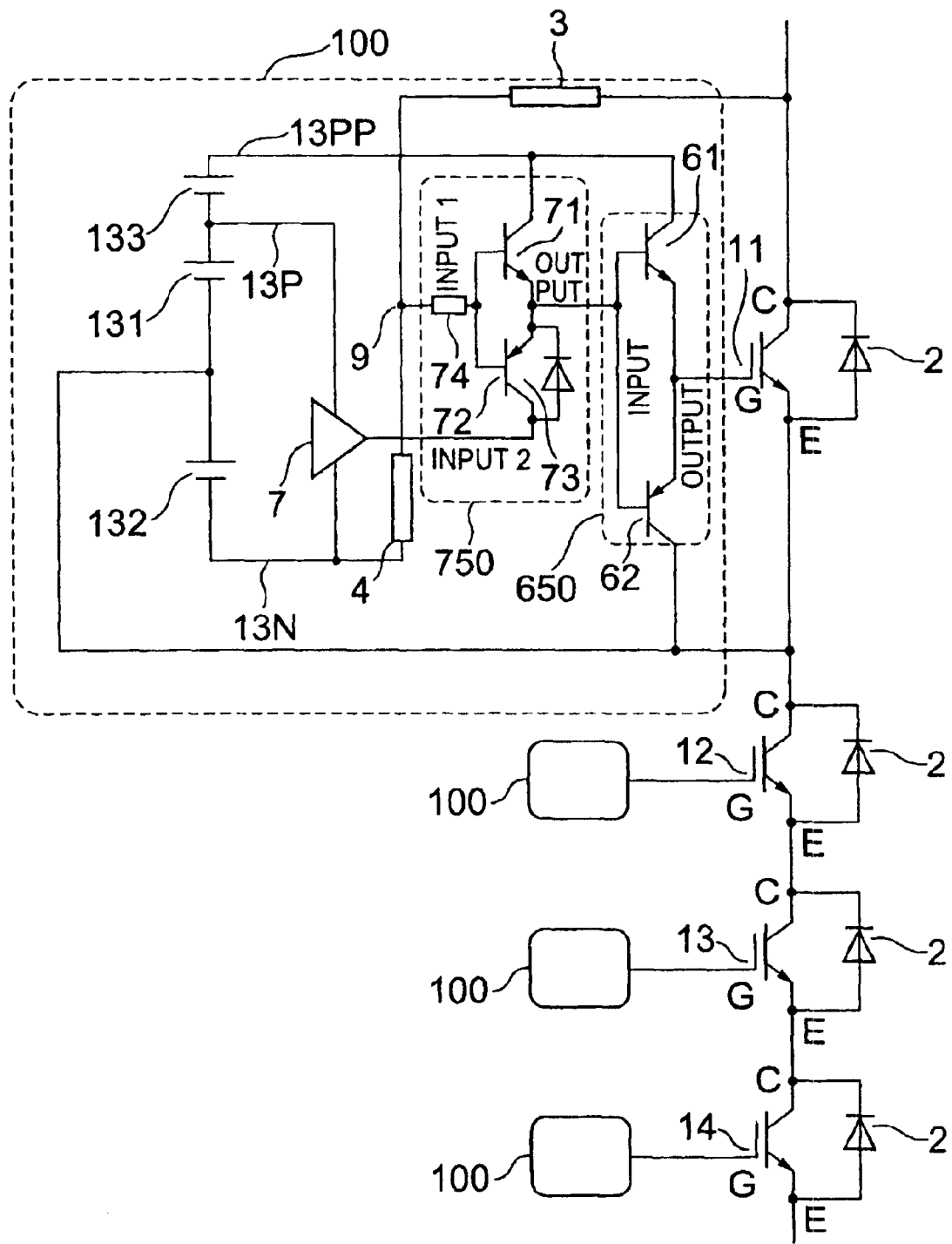
FIG. 10 is a circuit diagram for indicating a major unit of one arm of a power converter according to an embodiment 5 of the present invention.

As indicated in FIG. 10, in a semiconductor power converting apparatus of an embodiment 5 according to the present invention, the input 1 of the comparator 750 is connected to the voltage dividing point 9, and also the input 2 of the comparator 750 is connected to the output of the pulse generator 7, in comparison with the power converting apparatus of the embodiment 4 in which the input 1 of the comparator 750 is connected to the output of the pulse generator 7, and the input 2 of the comparator 750 is connected to the voltage dividing point 9 of the series connected resistors 3 and 4. Since the comparator 750 outputs a higher potential selected from the potentials of the input 1 and the input 2, a similar effect to that of the embodiment 4 may be achieved.

Embodiment 6

Figure 11:
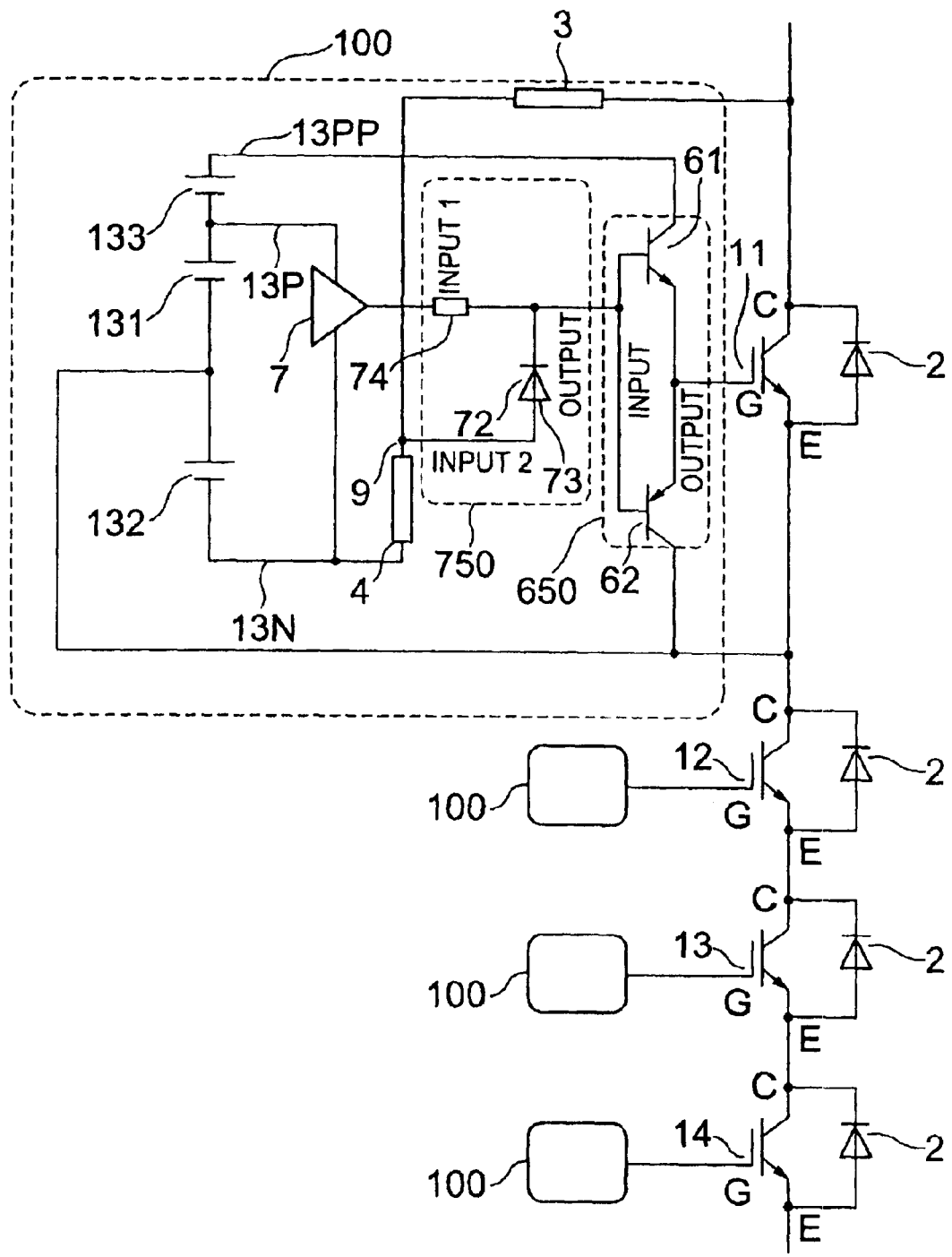
FIG. 11 is a circuit diagram for showing a major unit of one arm of a power converter according to an embodiment 6 of the present invention.

As indicated in FIG. 11, a semiconductor power converting apparatus according to an embodiment 6 of the present invention is arranged in such a manner that while both the pnp transistor 72 and the npn transistor 71 are eliminated from the circuit arrangement of the comparator 750 of the embodiment 4, the npn transistor 61 is connected to the power supply line 13PP having the higher potential than that of the power supply line 13P which drives the pulse generator 7.

The collector of the pnp transistor 62 is connected to the center point of series-connected voltage sources 131 and 132, the collector of IGBT 11 is connected to the dividing point 9 via resistor 3, and the collector of the npn transistor 61 is connected to the power supply line 13PP having a higher potential than the output potential of the pulse generator 7, while both the pnp transistor 62 and the npn transistor 61 constitute the buffer circuit 650. The pulse generator 7 is driven by both the voltage source 131 and the voltage source 132. When an IGBT is set to an ON state, the pulse generator 7 outputs the potential of the power supply line 13P, whereas when the IGBT is set to an OFF state, the pulse generator 7 outputs the potential of the power supply line 13N. The potential of the power supply line 13PP is higher than the potential of the power supply line 13P by such a voltage difference of the voltage source 133.

While the IGBT 11 is exemplified, a description will now be made of operations in which when the collector potential of the IGBT is increased under the ON state of this IGBT, the gate potential is increased so as to increase the saturated current value. When the collector potential of the IGBT 11 is increased, the potential of the voltage dividing point 9 is increased. Since the ON state of this IGBT is supposed, the pulse generator 7 outputs the potential of the power supply line 13P. The comparator 750 outputs the potential of the pulse generator 7 until the potential of the voltage dividing point 9 reaches the output potential of the pulse generator 750, namely, reached to the potential of the power supply line 13P, since an anode potential of a diode 73 is lower than a cathode potential thereof, and thus, this diode 73 becomes a high impedance.

When a potential of the voltage dividing point 9 is increased to a level higher than the output potential of the pulse generator 7, the diode 73 becomes a low impedance, so that the output of the comparator 750 can output the potential of the voltage dividing point 9. Since the collector of the npn transistor 61 is connected to the power supply line 13PP having the higher potential than the output potential of the pulse generator 7, the output potential of the pnp transistor 62 can be increased higher than a maximum output potential of the pulse generator 7, and also the gate potential of the IGBT 11 can be increased higher than the steady ON gate voltage.

As a consequence, also in this arrangement of the embodiment 6 shown in FIG. 7, since the gate potential of the IGBT 11 is increased to a level higher than the gate voltage under the steady ON state and, also, the saturated current value of the IGBT is increased similar to the embodiment 4, the IGBT can be protected from the overvoltage in a manner similar to that of the embodiment 4.

Embodiment 7

Figure 12:
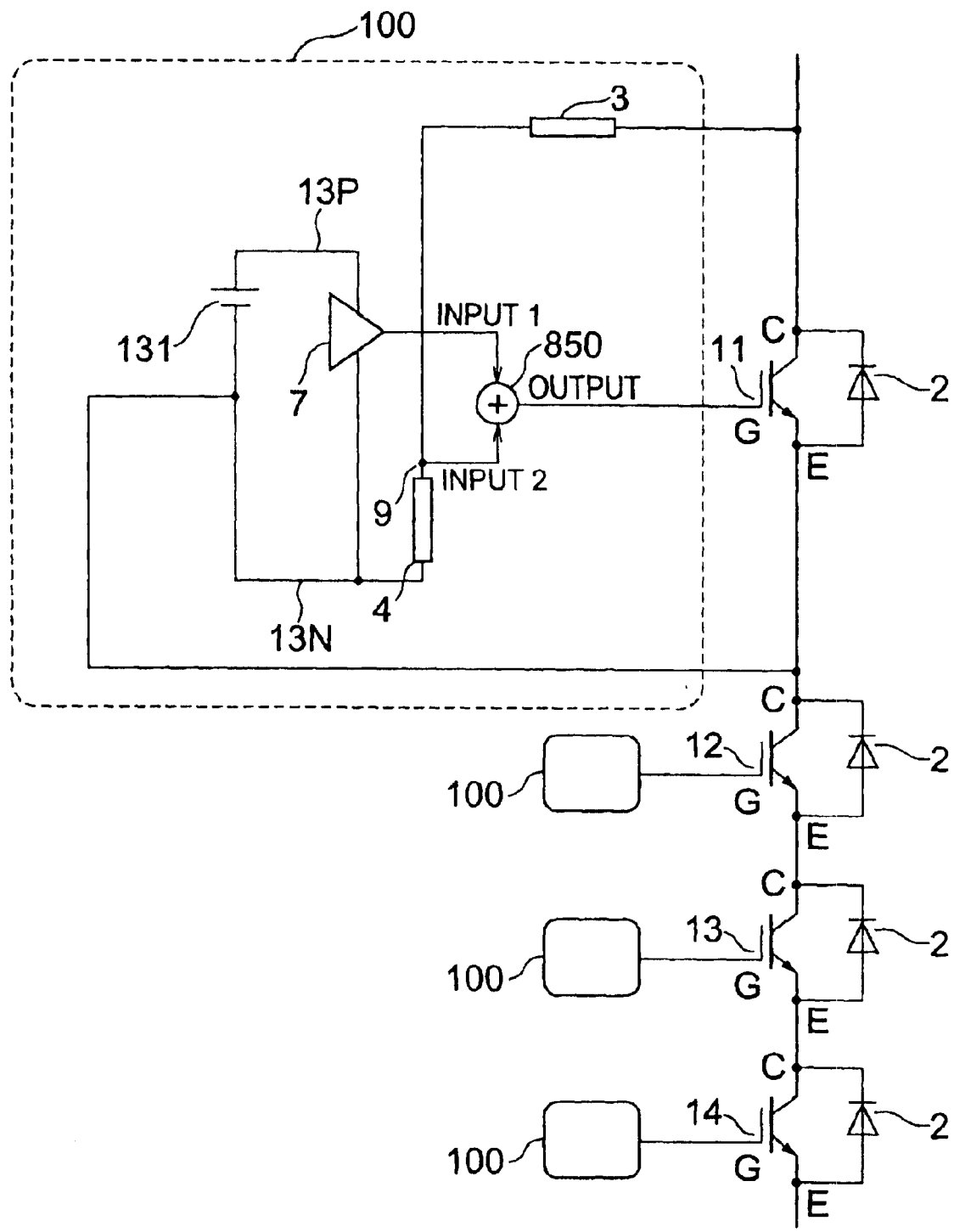
FIG. 12 is a circuit diagram for indicating a major unit of one arm of a power converter according to an embodiment 7 of the present invention.

As shown in FIG. 12, in a semiconductor power converting apparatus according to an embodiment 7 of the present invention, while both an output of the pulse generator 7 and a potential of the voltage dividing point 9 are inputted to an adder 850. This adder 850 controls a gate potential applied to an IGBT by adding the potential of the voltage dividing point 9 to the potential of the pulse generator 7.

When the collector potential of the IGBT 11 is increased, the potential of the voltage dividing point 9 is increased. Since the gate of the IGBT 11 is controlled in accordance with a potential obtained by adding the output potential of the pulse generator 7 to the potential at the voltage dividing point 9, the gate potential of the IGBT is also increased, so that the saturated current value of the IGBT 11 can be increased. As a result, similar to the embodiment 1, the IGBT can be protected from the overvoltage also in this embodiment 7.

According to the above-described embodiments of the present invention, in order to protect the MOS control semiconductor devices from the overvoltage, when the overcurrent flows through the MOS control semiconductor devices, it is possible to avoid such an operation that the overvoltage is applied to such an MOS control semiconductor having the minimum saturated current among the series-connected MOS control semiconductor devices, while such a semiconductor element having an avalanche voltage equal to the high withstand voltage is not employed.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor power converting apparatus comprising:
   at least one series arrangement of insulated-gate bipolar transistors (IGBTs), each IGBT being responsive to a gate voltage under the control of a corresponding driver,
   wherein said driver contains a power supply line having a higher potential than a gate voltage of an IGBT coupled thereto when said IGBT is in a steady ON state; and
   wherein said driver causes an increase of the gate voltage of said IGBT, in accordance with a current of said power supply line, when a potential difference between said power supply line and an emitter of said IGBT is constant and a collector voltage thereof exceeds a predetermined value under an ON state.

2. A semiconductor power converting apparatus according to claim
   wherein said driver includes a gate circuit and each IGBT in said series arrangement has a separate gate circuit coupled thereto, each gate circuit responding to a collector voltage exceeding a predetermined value of a corresponding IGBT to cause an increase in the gate voltage of that IGBT and, correspondingly, cause an increase in the saturation current level thereof.

3. A semiconductor power converting apparatus according to claim 2,
   wherein said at least one series arrangement of IGBTs includes a plurality of series arrangements of IGBTs constituted as plural sets of two series-connected arms, each arm including a respective said series arrangement of IGBTS, each set of two series-connected arms being coupled across a power source and a common connection of the two series-connected arms of each set being coupled to a corresponding load element of the power converting apparatus.

4. A semiconductor power converting apparatus comprising:
   at least one series arrangement of insulated-gate bipolar transistors (IGBTs) connected to a power supply line;
   a circuit for outputting a first gate voltage value for switching each of said IGBTs;
   a circuit for outputting a second gate voltage value which becomes higher when a collector voltage of each of said IGBTs is increased; and
   a circuit for comparing said first and second gate voltage values with each other, and for controlling the gate voltage of each of said IGBTs to be the higher gate voltage value,
   wherein, when the collector voltage of each of said IGBTs is higher than a collector voltage under steady OFF state of each of said IGBTs, the gate voltage of each of said IGBTs is increased to be higher than a gate voltage of each of the IGBTs under steady ON state.

5. A semiconductor power converting apparatus according to claim 4, wherein:
   said circuit for comparing said first and second gate voltage values with each other and for controlling the gate voltage of each of the IGBTs to be said higher gate voltage value includes an npn transistor and a pnp transistor which are connected in a complementary manner;
   a collector of said pnp transistor is connected to an output of the circuit for outputting the second gate voltage value for switching said MOS control semiconductor; and
   a base of said pnp transistor and a base of said npn transistor are connected to an output of said circuit for outputting the first gate voltage value which becomes higher when the collector voltage of each of said IGBTs is increased.

6. A semiconductor power converting apparatus according to claim 5, wherein a diode is connected in inverse-parallel with said pnp transistor.

7. A semiconductor power converting apparatus according to claim 4, wherein a diode is connected in inverse-parallel with said pnp transistor.

8. A semiconductor power converting apparatus comprising at least one series arrangement of insulated-gate bipolar transistors (IGBTs) connected to a power supply line, each IGBT being responsive to a gate voltage under the control of a corresponding driver coupled thereto, each driver including:
   a circuit for outputting a first gate voltage value for switching a corresponding IGBT;
   a circuit for outputting a second gate voltage value which becomes higher when a collector voltage of said corresponding IGBT is increased; and
   a circuit for comparing said first and second gate voltage values with each other, and for controlling the gate voltage of said corresponding IGBT to be the higher gate voltage value,
   wherein, when the collector voltage of said corresponding IGBT is higher than a collector voltage under steady OFF state of that IGBT, the gate voltage of said IGBT is increased to be higher than a gate voltage thereof under steady ON state.

9. A semiconductor power converting apparatus according to claim 8, wherein said driver is such that:
   said circuit for comparing said first and second gate voltage values with each other and for controlling the gate voltage of a corresponding IGBT to be said higher gate voltage value includes an npn transistor and a pnp transistor which are connected in a complementary manner;
   a collector of said pnp transistor is connected to an output of the circuit for outputting the second gate voltage value for switching said IGBT; and
   a base of said pnp transistor and a base of said npn transistor are connected to an output of said circuit for outputting the first gate voltage value which becomes higher when the collector voltage of said IGBT is increased.

10. A semiconductor power converting apparatus according to claim 9, wherein a diode is connected in inverse-parallel with said pnp transistor.

11. A semiconductor power converting apparatus according to claim 8, wherein a diode is connected in inverse-parallel with said pnp transistor.

12. A semiconductor power converting apparatus comprising at least one series arrangement of insulated-gate bipolar transistors (IGBTs) for connection to a power supply line, and control circuitry for controlling a gate voltage of each of said IGBTs, wherein said control circuitry includes:

means for outputting a first gate voltage value for switching each of said IGBTs;

means for outputting a second gate voltage value which becomes higher when a collector voltage of each of said IGBTs is increased; and means for controlling a gate voltage of each of said IGBTs to be a voltage obtained by adding said first gate voltage value to said second gate voltage value.

13. A semiconductor power converting apparatus according to claim 12, wherein a separate said control circuitry is provided for each of said IGBTs in the series arrangement.

14. A semiconductor power converting apparatus according to claim 13, wherein said at least one series arrangement of IGBTs include a plurality of series arrangements of IGBTs constituted as plural sets of two series-connected arms, each arm including a respective said series arrangement of IGBTS, each set of two series-connected arms being coupled across a power source and a common connection of the two series-connected arms of each set being coupled to a corresponding load element of the power converting apparatus.

15. A semiconductor power converting apparatus comprising at least one insulated-gate bipolar transistor (IGBT), and a gate driver for controlling a gate voltage of said IGBT, said gate driver being comprised of:

a power supply line having a higher potential than a gate potential when said IGBT is in a steady ON state; and means for supplying a current from the power source line to the gate of said IGBT so as to increase the gate voltage of said IGBT when a potential difference between said power supply line and an emitter of said IGBT is constant, and a collector voltage of said IGBT exceeds a predetermined value under an ON state of said IGBT.

* * * * *